United States Patent
Liu et al.

(10) Patent No.: US 9,425,387 B1
(45) Date of Patent: Aug. 23, 2016

(54) MAGNETIC ELEMENT WITH PERPENDICULAR MAGNETIC ANISOTROPY FOR HIGH COERCIVITY AFTER HIGH TEMPERATURE ANNEALING

(71) Applicant: Headway Technologies, Inc., Milpitas, CA (US)

(72) Inventors: Huanlong Liu, San Jose, CA (US); Yuan-Jen Lee, Fremont, CA (US); Jian Zhu, San Jose, CA (US); Guenole Jan, San Jose, CA (US); Ruth Tong, Los Gatos, CA (US); Luc Thomas, San Jose, CA (US)

(73) Assignee: Headway Technologies, Inc., Milpitas, CA (US)

( * ) Notice: Subject to any disclaimer, the term of this patent is extended or adjusted under 35 U.S.C. 154(b) by 0 days.

(21) Appl. No.: 14/847,433

(22) Filed: Sep. 8, 2015

(51) Int. Cl.
  *H01L 29/82* (2006.01)
  *H01L 43/10* (2006.01)
  *H01L 43/02* (2006.01)
  *H01L 43/08* (2006.01)
  *H01L 43/12* (2006.01)
  *G11C 11/16* (2006.01)

(52) U.S. Cl.
  CPC .............. *H01L 43/10* (2013.01); *G11C 11/161* (2013.01); *H01L 43/02* (2013.01); *H01L 43/08* (2013.01); *H01L 43/12* (2013.01)

(58) Field of Classification Search
  CPC ......... H01L 43/08; H01L 43/12; H01L 43/10; H01L 43/02
  USPC ........... 257/421, 422, 428; 438/728, 746, 795
  See application file for complete search history.

(56) References Cited

U.S. PATENT DOCUMENTS

| | | | |
|---|---|---|---|
| 6,544,801 | B1 | 4/2003 | Slaughter et al. |
| 8,852,762 | B2 | 10/2014 | Abraham et al. |
| 8,946,834 | B2 | 2/2015 | Wang et al. |
| 9,006,704 | B2 | 4/2015 | Jan et al. |
| 2010/0148167 | A1 | 6/2010 | Whig et al. |
| 2014/0349415 | A1 | 11/2014 | Oguz et al. |
| 2015/0008547 | A1 | 1/2015 | Pi et al. |

OTHER PUBLICATIONS

"Current-driven excitation of magnetic multilayers," J.C. Slonczewski, Journal of Magnetism and Magnetic Materials 159, Jun. 1996, L1-L7, Elsevier.

"Microwave Assisted Magnetic Recording," by Jian-Gang Zhu et al., IEEE Transactions on Magnetics, vol. 44, No. 1, Jan. 2008, pp. 125-131.

*Primary Examiner* — Tan N Tran
(74) *Attorney, Agent, or Firm* — Saile Ackerman LLC; Stephen B. Ackerman

(57) ABSTRACT

A magnetic tunnel junction (MTJ) is disclosed wherein a free layer has an interface with a tunnel barrier and a second interface with a metal oxide layer to promote perpendicular magnetic anisotropy (PMA) therein. A diffusion barrier is formed on a side of the metal oxide layer opposite the second interface to prevent non-magnetic metals in a hard mask or electrode from migrating to the second interface and degrading free layer PMA. A second diffusion barrier may be formed between a second electrode and a reference layer. The diffusion barrier may be a single layer of SiN, TiN, TaN, Mo, or CoFeX where X is Zr, P, B, or Ta, or is a multilayer such as CoFeX/Mo wherein CoFeX contacts the metal oxide layer and Mo adjoins a hard mask. As a result, coercivity is maintained or increased in the MTJ after annealing at 400° C. for 30 minutes.

31 Claims, 3 Drawing Sheets

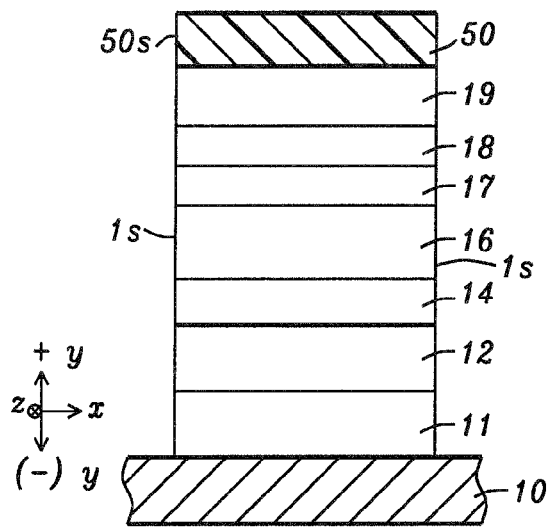
FIG. 9
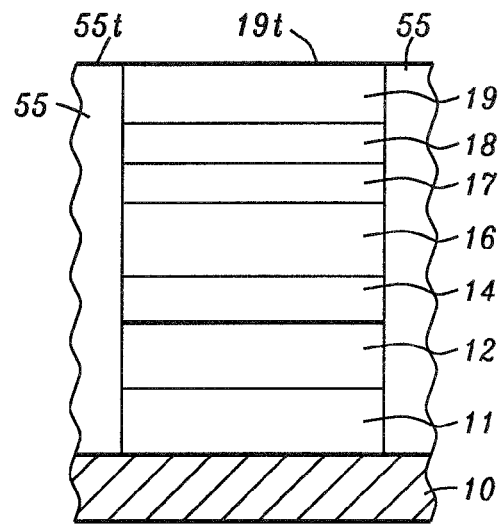
FIG. 10
| Element | Oxide | Free energy of formation per mol of $O_2$ ($\times 10^{-6}$ J.kmol$^{-1}$) |
|---|---|---|
| Au | $Au_2O_3$ | 109 |
| Ag | $Ag_2O_3$ | -7 |
| Ru | $RuO_2$ | -253 |
| Cu | $CuO$ | -254 |
| Co | $CoO$ | -426 |
| Ni | $NiO$ | -432 |
| Fe | $FeO$ | -488 |
| Fe | $Fe_2O_3$ | -495 |
| Mo | $MoO_2$ | -502 |
| W | $WO_3$ | -509 |
| Sn | $SnO$ | -514 |
| Zn | $ZnO$ | -636 |
| Cr | $Cr_2O_3$ | -699 |
| Nb | $Nb_2O_5$ | -708 |
| Ta | $Ta_2O_5$ | -788 |
| B | $B_2O_3$ | -796 |
| Si | $SiO_2$ | -805 |
| Mn | $Mn_2O_3$ | -854 |
| Ti | $TiO_2$ | -890 |
| Zr | $ZrO_2$ | -1037 |
| Al | $Al_2O_3$ | -1053 |
| Ba | $BaO$ | -1056 |
| Hf | $HfO_2$ | -1084 |
| Mg | $MgO$ | -1146 |
| Ca | $CaO$ | -1208 |
FIG. 11

MAGNETIC ELEMENT WITH PERPENDICULAR MAGNETIC ANISOTROPY FOR HIGH COERCIVITY AFTER HIGH TEMPERATURE ANNEALING

RELATED PATENT APPLICATIONS

This application is related to U.S. Pat. No. 8,946,834; U.S. Pat. No. 9,006,704; and U.S. Patent Application 2015/0008547; assigned to a common assignee and herein incorporated by reference in their entirety.

TECHNICAL FIELD

This disclosure relates to magnetic devices that utilize magnetic tunnel junctions (MTJs) with perpendicular magnetic anisotropy (PMA), and in particular, to inserting a diffusion barrier between a capping layer and top electrode to maintain coercivity (Hc) in the MTJ stack following annealing or during high temperature semiconductor processes of about 400° C.

BACKGROUND

Magnetoresistive Random Access Memory (MRAM) has a read function based on a tunneling magnetoresistive (TMR) effect in a MTJ stack wherein a tunnel barrier is formed between a free layer and a reference layer. The free layer serves as a sensing layer by switching the direction of its magnetic moment in response to external fields (media field) while the reference layer has a fixed magnetic moment. The electrical resistance through the tunnel barrier (insulator layer) varies with the relative orientation of the free layer moment compared with the reference layer moment and thereby provides an electrical signal that is representative of the magnetic state in the free layer. In MRAM, the MTJ is formed between a top conductor (electrode) and bottom conductor. When a current is passed through the MTJ, a lower resistance is detected when the magnetization directions of the free and reference layers are parallel ("0" memory state), and a higher resistance is noted when they are anti-parallel ("1" memory state). The TMR ratio is dR/R where R is the minimum resistance of the MTJ, and dR is the difference between the lower and higher resistance values. The tunnel barrier is typically about 10 Angstroms thick so that a current through the tunnel barrier can be established by a quantum mechanical tunneling of conduction electrons.

Another version of MRAM that relies on a TMR effect, and is referred to as a spintronic device that involves spin polarized current, is called spin-transfer torque (STT) MRAM and is described by C. Slonczewski in "Current driven excitation of magnetic multilayers", J. Magn. Magn. Mater. V 159, L1-L7 (1996). J-G. Zhu et al. has described another spintronic device called a spin transfer oscillator (STO) in "Microwave Assisted Magnetic Recording", IEEE Trans. on Magnetics, Vol. 44, No. 1, pp. 125-131 (2008) where a spin transfer momentum effect is relied upon to enable recording at a head field significantly below the medium coercivity in a perpendicular recording geometry.

MTJ elements wherein one or both of the free layer and reference layer have perpendicular magnetic anisotropy (PMA) are preferred over their counterparts that employ in-plane anisotropy because the former has an advantage in a lower writing current for the same thermal stability, and better scalability. In MTJs with PMA, the free layer has two preferred magnetization orientations that are perpendicular to the physical plane of the layer. Without external influence, the magnetization or magnetic moment of the free layer will align to one of the preferred two directions, representing information "1" or "0" in the binary system. For memory applications, the free layer magnetization direction is expected to be maintained during a read operation and idle, but change to the opposite direction during a write operation if the new information to store differs from its current memory state. The ability to maintain free layer magnetization direction during an idle period is called data retention or thermal stability. The level of stability required is typically related to the memory application. A typical non-volatile memory device may require thermal stability at 125° C. for about 10 years.

CoFeB or the like is commonly used as the free layer (FL) and MgO is selected as the tunnel barrier to generate PMA along the FL/MgO interface. However, the physical shape of the free layer having a lateral dimension more than ten times the thickness tends to induce in-plane anisotropy. If the in-plane anisotropy is greater than the PMA component, the FL magnetization direction will be in-plane. As FL thickness (volume) increases, a greater portion of the free layer is away from the FL/tunnel barrier interface. A thicker free layer means a higher in-plane magnetic moment and a reduction in PMA and coercivity. Usually, free layer thickness must be maintained below 20 to 25 Angstroms to realize a condition where the PMA component is greater than the in-plane anisotropy in the magnetic layer.

In a memory element such as STT-MRAM, the current needed to change the magnetic orientation of a magnetic region (free layer) is proportional to the net polarization of the current, the volume, magnetization, Gilbert damping constant, and anisotropy field of the magnetic region to be affected. The critical current ($i_c$) required to perform such a change in magnetization is given in equation (1):

$$i_c = \frac{\alpha e V M s}{g\hbar}\left[H_{k_{eff},\parallel} + \frac{1}{2}H_{k_{eff},\perp}\right] \quad (1)$$

where e is the electron charge, α is a Gilbert damping constant, Ms is the saturation magnetization of the free layer, h is the reduced Plank's constant, g is the gyromagnetic ratio, $H_{k_{eff},\parallel}$ is the in-plane anisotropy field, and $H_{k_{eff},\perp}$ is the out-of-plane anisotropy field of the magnetic region to switch, and V is the volume of the free layer. For most applications, the spin polarized current must be as small as possible. When the free layer has a magnetization direction perpendicular to the film plane, the critical current needed to switch the magnetic element is directly proportional to the perpendicular anisotropy field as indicated in equation (2):

$$i_c = \frac{\alpha e M s V H_{k_{eff},\perp}}{g\hbar} \quad (2)$$

Thermal stability is a function of the perpendicular anisotropy field as shown in equation (3) where $k_B$ is the Boltzmann constant and T is the temperature:

$$\Delta = \frac{M_S V H_{k_{eff},\perp}}{2k_B T} \quad (3)$$

and the perpendicular anisotropy field of a magnetic layer is expressed in equation (4) as:

$$H_{k_{eff},\perp} = -4\pi M_s + \frac{2K_U^{+,s}}{M_s d} + H_{k,\chi,\perp} \quad (4)$$

where $M_s$ is the saturation magnetization, d is the thickness of the magnetic layer, $H_{k,\chi,\perp}$ is the crystalline anisotropy field in the perpendicular direction, and $K_U^{\perp,s}$ is the surface perpendicular anisotropy of the top and bottom surfaces of the magnetic layer. The shape anisotropy field is represented by the term $(-4\pi M_s)$.

In order to improve thermal stability by increasing the value $K_U^{\perp,s}$, a second free layer/metal oxide interface is commonly introduced on a side of the free layer opposite to the tunnel barrier. The metal oxide may be another MgO layer and is often called a cap layer or a Hk enhancing layer. Thus, a MgO/FL/MgO stack will substantially increase total PMA in the free layer thereby allowing a thicker free layer and higher thermal stability. The cap layer typically contacts an uppermost MTJ layer called a hard mask, which in turn connects to a top electrode and through a top electrode array to complementary-metal-oxide-semiconductor (CMOS) units in a memory chip. The hard mask generally has a thickness in the hundreds of Angstroms, and is comprised of a metal such as Ta, Ru, Mo, MnPt, and their oxides and nitrides as required for conventional techniques in manufacturing integrated circuits. The remainder of the MTJ typically has a thickness of about 100 Angstroms, which means the volume of hard mask material is much greater than that of the other MTJ layers.

Since MTJ elements are implemented in CMOS devices, the MTJ must be able to withstand annealing temperatures up to about 400° C. for 30 minutes that are commonly applied to improve the quality of the CMOS units for semiconductor purposes. In most cases, this temperature exceeds the optimum temperature for best magnetic performance in the MTJ or MRAM. MTJs are usually annealed in the 300-330° C. degree range to obtain the desired magnetic properties.

One problem resulting from high temperature anneal around 400° C. is the diffusion of hard mask materials into the MTJ. Although a fully oxidized MgO cap layer is a good diffusion blocking material, the resistance×area (RA) product of fully oxidized MgO is quite high and adds a large series resistance to the MTJ that in turn undesirably reduces the signal difference between reading out "0" and "1" information stored in the device. Therefore, it is practical to employ only partially oxidized MgO cap layers less than 10 Angstroms thick. Unfortunately, hard mask materials are heavier than Mg and do not bind well with Mg in the partially oxidized MgO cap thereby enabling easier diffusion of heavier metals to the free layer which then degrades the capacity of the FL/cap layer interface to promote PMA in the free layer. As a result, free layer PMA is reduced and thermal stability is less compared with a condition where the MTJ is annealed only to 330° C., for example. Free layer coercivity is also less after high temperature annealing to around 400° C. than after 300-330° C. annealing. However, it is an important requirement to maintain coercivity after high temperature processing.

Thus, there is a significant challenge to increase PMA and enhance thermal stability of free layers to improve the performance of MTJs at elevated temperatures typical of back end of line (BEOL) semiconductor processes. Current technology fails to provide high Hc and thermal stability in a free layer with PMA character that will withstand high temperature processing up to at least 400° C., which is required in semiconductor fabrication methods. Therefore, an improved MTJ stack is needed to enable a free layer with thermal stability to at least 400° C., and that exhibits PMA for optimum magnetic memory performance.

SUMMARY

One objective of the present disclosure is to provide a MTJ stack in a magnetic device wherein the free layer has PMA and coercivity (Hc) that is maintained after high temperature processing including annealing at temperatures up to 400° C.

A second objective of the present disclosure is to provide a MTJ stack of layers according to the first objective such that other properties including the TMR ratio, and resistance×area (RA) value are maintained at an acceptable level.

According to one embodiment of the present disclosure, these objectives are achieved by configuring a magnetic tunnel junction (MTJ) with a tunnel barrier/free layer (FL)/metal oxide stack to include a diffusion barrier between the metal oxide (cap layer) and overlying hard mask to prevent non-magnetic metals in the hard mask from diffusing through the metal oxide (cap) layer and degrading PMA established along the FL/metal oxide interface. In an alternative embodiment wherein the MTJ has a metal oxide/free layer/tunnel barrier stack and the metal oxide serves as a Hk enhancing layer, a diffusion barrier is inserted between the metal oxide and bottom electrode. Thus, the FL interfaces with a metal oxide along both of its top and bottom surfaces to induce or enhance PMA therein. Additional layers may be included such as a seed layer formed at the bottom of the MTJ stack. Furthermore, a second diffusion barrier may be inserted between the reference layer and bottom (or top) electrode. In a MRAM or STT-MRAM device, the hard mask contacts a bottom surface of the top electrode while the seed layer contacts a top surface of the bottom electrode in a bottom spin valve design.

The free layer may be a single layer made of Co, Fe, or an alloy thereof with one or more elements including Ni and B. In an alternative embodiment, the free layer has two magnetic layers FL1 and FL2 separated by an antiferromagnetic coupling layer such as Ru, or separated by a non-magnetic insertion layer that is Ta or the like which serves as a moment diluting layer. Furthermore, one of the aforementioned free layer configurations may further include a pair of dusting layers formed as bottom and uppermost layers in the free layer stack. The dusting layer is for example, one of Co, Fe, or an alloy thereof, which promotes PMA in the free layer and thereby increases He and Hk. A dusting layer also improves the tunneling magnetoresistance (TMR ratio) in the MTJ. A reference layer adjoins a surface of the tunnel barrier that is opposite the free layer. In a preferred embodiment, the reference layer has a synthetic antiparallel (SyAP) configuration wherein two magnetic layers called AP1 and AP2 are antiferromagnetically coupled through a Ru layer, for example.

A key feature is the diffusion barrier composition. In one aspect, the diffusion barrier is a single layer consisting of SiN, TiN, TaN, Mo, or CoFeX or CoFeNiX wherein X is one of Zr, Hf, Nb, Cu, Mo, B, P, and Ta. In particular, the diffusion barrier has a lower affinity to form a metal oxide than the metal in the adjoining cap layer or Hk enhancing layer. As a result, the diffusion barrier remains amorphous at temperatures proximate to 400° C., thereby avoiding a crystalline structure that enables non-magnetic metals from the top electrode (or bottom electrode) to pass through and diffuse along crystal boundaries into the cap layer or Hk enhancing layer. In other embodiments, the diffusion barrier is a stack of two or more layers including one or more non-magnetic metal or alloy layers of Mo, Zr, Nb, Hf, SiN, TIN, or TaN, and one or more of CoFeX or CoFeNiX wherein the CoFeX or CoFeNiX layer contacts the cap layer or Hk enhancing layer. The non-magnetic metal or alloy layer contacts the hard mask in a bottom spin valve, or contacts the bottom electrode or optional seed layer in a top spin valve configuration.

After all of the layers in the MTJ are laid down, an anneal process comprising a temperature of about 400° C. is performed to enhance PMA in the free layer and reference layer, increase coercivity (Hc) and Hk, and rearrange the lattice structure to obtain a higher TMR ratio. Thereafter, a conventional patterning and etching sequence is employed to convert a MTJ stack of layers formed on a bottom electrode into a plurality of MTJ elements.

DESCRIPTION OF THE DRAWINGS

FIGS. 8-10 are cross-sectional views depicting a sequence of steps during the fabrication of a MTJ with a bottom spin valve design according to an embodiment of the present disclosure.

FIG. 11 is a table showing the free energy of oxide formation for various elements.

DETAILED DESCRIPTION

Figure 1:
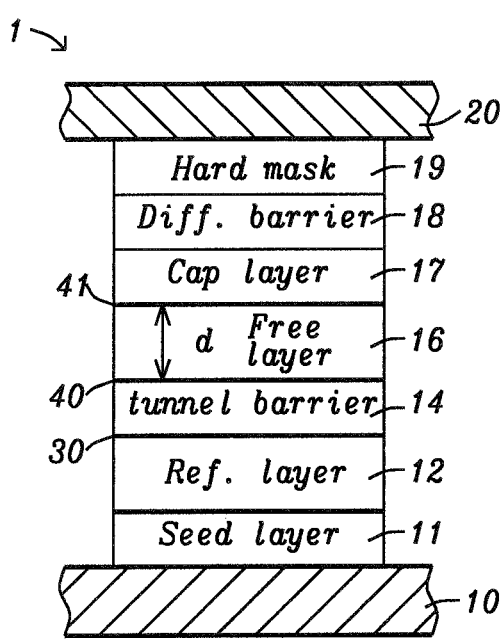
FIG. 1 is a cross-sectional view of a MTJ with a bottom spin valve design with a diffusion barrier formed between a cap layer and a top electrode according to a first embodiment of the present disclosure.

The present disclosure is a MTJ element wherein a free layer has thermal stability to at least 400° C. because of perpendicular magnetic anisotropy (PMA) therein that is established by interfaces with two metal oxide layers, and wherein a diffusion barrier prevents non-magnetic metals from a hard mask or bottom electrode from diffusing into an adjoining metal oxide layer thereby maintaining PMA and Hc in the free layer. The MTJ element may be employed in magnetic memory devices such as MRAM and STT-MRAM, in spintronic devices such as MAMR and STO, and as a TMR sensor between top and bottom shields in a read head if high temperature processing is employed. The MTJ may have a bottom spin valve, top spin valve, or dual spin valve design as appreciated by those skilled in the art. Although a plurality of MTJ elements is usually formed on a substrate, only one MTJ is depicted in the exemplary embodiments in order to simplify the drawings. The terms "Hk enhancing" and "cap" may be used interchangeably when referring to a metal oxide layer that induces PMA in an adjoining free layer. A cap layer as defined herein has a position above the free layer in a MTJ stack, and often adjoins a bottom surface of an overlying hard mask layer. On the other hand, a Hk enhancing layer may contact either a bottom surface of the free layer in a top spin valve, or the top surface of the free layer in a bottom spin valve design.

In related U.S. Pat. No. 8,946,834, we disclosed a MTJ having improved thermal stability by way of a tunnel barrier/free layer/cap layer configuration in which both of the tunnel barrier and cap layer are a metal oxide, and wherein dusting layers such as Co or CoFe are included as bottom and uppermost layers in the free layer stack comprising CoFeNiB to further improve thermal stability. According to related U.S. Pat. No. 9,006,704, the cap layer may further comprise an uppermost Ru layer in addition to a metal oxide (Hk enhancing) layer that adjoins the free layer. Ru is advantageously used since it has a higher energy of oxide formation than the metal in the adjoining Hk enhancing layer and reduces the likelihood of oxygen from the metal oxide migrating into the uppermost cap layer during high temperature processing. As a result, interfacial perpendicular anisotropy is maintained at the free layer/Hk enhancing layer interface which means PMA is not diminished by a 400° C. anneal process. An alternative structure for retaining a high degree of oxidation in the Hk enhancing layer at the free layer interface is disclosed in related U.S. Patent Application 2015/0008547 wherein the Hk enhancing layer may be a laminated cap layer including a lower interface oxide layer, and one or two overlying transition metal oxide layers that have a lower affinity for oxygen and oxide formation than a metal (Mg) in the interface oxide. FIG. 11 lists free energy of oxide formation values for various metals. As one proceeds down the list of metals, there is a greater tendency for metal oxide formation when a metal is exposed to oxygen.

Now we have discovered that performance in a MTJ with a tunnel barrier/free layer/metal oxide stack of layers is further improved by including a diffusion barrier otherwise known as a protection layer between the metal oxide and an overlying hard mask in a bottom spin valve scheme to maintain FL coercivity after high temperature processing associated with CMOS technology where memory elements are integrated with semiconductor functionality. Alternatively, in a top spin valve with a metal oxide/free layer/tunnel barrier stack, the diffusion barrier is inserted between the metal oxide and bottom electrode (or optional seed layer) to prevent non-magnetic metals in the bottom electrode or optional seed layer from migrating into the metal oxide and disrupting PMA established by the metal oxide/free layer interface. In other words, metal migration through the metal oxide layer could cause a lower oxidation state in the Hk enhancing layer proximate to the free layer but is blocked by the presence of the diffusion barrier. Preferably, the metal selected for the diffusion barrier is heavier (has a higher atomic number) than the metal in the metal oxide layer.

Referring to FIG. 1, a MTJ 1 formed according to a first embodiment of the present disclosure is depicted wherein an optional seed layer 11, reference layer 12, tunnel barrier 14, free layer 16, cap layer 17, diffusion barrier 18, and hard mask 19 are sequentially formed on a bottom electrode 10 in a MRAM, STT-MRAM, or STO device. The bottom electrode may be formed on a substrate (not shown) that in some embodiments is a semiconductor structure that may include transistors and other associated control devices. In another embodiment, the bottom electrode may be a bottom shield in a TMR sensor or a main pole layer in a STO device. All layers are typically sputter deposited in a sputter deposition mainframe that has at least one oxidation chamber and an etching chamber. In a preferred embodiment, the tunnel barrier is formed by depositing a first metal layer, performing a natural oxidation or radical oxidation to transform the first metal to a first metal oxide, and then depositing a second metal on the first metal oxide. During a subsequent anneal process, the second metal layer absorbs oxygen from the free layer and first metal oxide to generate a substantially uniform metal oxide layer. It should be understood that in a STO device, the reference layer serves as a spin injection layer (SIL) and free layer functions as a field generation layer (FGL).

Seed layer 11 is generally employed to maintain or enhance PMA in reference layer 12 and facilitates smooth and uniform crystalline growth in the overlying MTJ layers. The seed layer may be one or more of NiCr, NiFeCr, Pd, Pt, Ta, Ru, or other metals or alloys used in the art.

Reference layer 12 preferably is a SyAP stack of layers having an AP2/coupling layer/AP1 configuration wherein the AP1 layer has an interface with the tunnel barrier, and each of AP1 and AP2 are one or more of Co, Fe, CoFe, or alloys thereof with an additional element including one or both of Ni and B. AP1 and AP2 layers have magnetic moments in opposite directions because of antiferromagnetic coupling provided by a Ru, Rh, or Ir coupling layer. PMA is induced or enhanced in the reference layer 12 through interface 30 with tunnel barrier 14. In another embodiment, one or both of the AP1 and AP2 layers are a laminated structure that is one of $(Co/Ni)_n$, $(Co/Pd)_n$, $(Co/Pt)_n$, $(CoFe/Ni)_n$, $(Co/NiFe)_n$, $(Co/NiCo)_n$, or other laminated stacks exhibiting intrinsic PMA where n is between 2 and 30. Preferably, each Co or Co alloy layer in the laminated structure has a thickness between 0.5 and 5 Angstroms while each Pd, Pt, Ni, or Ni alloy layer has a thickness from 2 to 10 Angstroms. The Co or Co alloy layer is generally thinner than the Ni, Ni alloy, Pt, or Pd layer.

When the AP1 layer comprises one of the aforementioned laminated structures, a transition layer that is Co, CoFe, or CoFeB may be inserted as the uppermost layer in the AP1 stack. In some embodiments, a CoFeB/Co transition layer may be formed in which the CoFeB portion is from 4 to 8 Angstroms thick while the Co layer portion has a thickness from 3 to 5 Angstroms. Co is often used as the uppermost layer in the reference layer stack to form an interface 30 with the tunnel barrier layer since Co is more resistant to oxidation than a CoFeB (or CoFe) layer. In other words, oxygen is able to migrate out of a MgO tunnel barrier layer into a reference layer during annealing thereby causing partial oxidation of CoFeB, for example, which leads to a degradation in the MR ratio.

The tunnel barrier layer 14 may be any metal oxide layer that induces a spin dependent tunneling effect between the reference layer and free layer. Although MgO is often preferred since it provides an optimum TMR ratio, other materials including MgN, MgON, and oxides, nitrides, or oxynitrides of Al, Ti, Zn, Hf, AlTi, MgZn, or Ta may be employed as the tunnel barrier. Furthermore, laminations of one or more of the aforementioned materials may be selected as the tunnel barrier.

The free layer 16 adjoins a top surface of the tunnel barrier 14 in a bottom spin valve design, and according to one embodiment is a single layer that is one of Co, Fe, CoFe, or alloys thereof with an optional additional element including one or both of Ni and B. However, the free layer may have a bilayer or trilayer configuration represented by FL1/FL2 or FL1/FL2/FL3 where each of FL1, FL2, and FL3 are magnetic layers made of Co, Fe, CoFe or alloys thereof wherein magnetic moments of all the two or three layers are aligned in the same direction through ferromagnetic coupling. The alloys may include Ni, B, or transition metal elements including Ta, Zr, Hf, Mg, Mo, and Nb. In other embodiments, the free layer has a FL1/Ru/FL2 configuration wherein FL1 and FL2 layers are antiferromagnetically coupled. In yet another embodiment, the free layer is one of the laminated structures described previously with respect to reference layer composition. A laminated structure that is $(Co/Ni)_n$ or the like is considered to have intrinsic PMA.

In a preferred embodiment, the free layer 16 has a FL1/M/FL2 stack in which M is layer with a thickness from 5 to 10 Angstroms and is made of a non-magnetic element such as Ta, Ti, W, Zr, Hf, Nb, Mo, V, Mg, or Cr that provides a moment dilution effect. The FL1 and FL2 layers are ferromagnetically coupled through the M layer. In other words, for a fixed free layer thickness d, a FL1/M/FL2 configuration will have a smaller in-plane magnetization component than a FL1/FL2 stack. It follows that interfacial perpendicular anisotropy at the interface 40 between the tunnel barrier and free layer, and at the interface 41 between the free layer and cap layer more easily overcomes the shape anisotropy field and generates substantial PMA in the free layer with a FL1/M/FL2 configuration.

PMA in the free layer is induced or enhanced by interfacial perpendicular anisotropy generated in a portion thereof adjacent to a first interface 40 with the tunnel barrier layer 14, and in a portion adjacent to a second interface 41 with an Hk enhancing layer also known in bottom spin valve designs as cap layer 17. Preferably, interfacial (surface) perpendicular anisotropy exceeds the shape anisotropy field for the free layer to provide PMA and a net magnetization direction that is perpendicular to the two interfaces. As a result, the free layer will have greater thermal stability, and higher Hc after high temperature processing up to about 400° C. than a free layer with in-plane magnetization. Here, the term "about" indicates that the temperature may reach 410° C. or 420° C. for a certain period of time due to thermal fluctuations above a target temperature in a process chamber. Note that the thickness of free layer 16 is represented by "d" in equation (4) presented previously. Thus, as the value for "d" is reduced, the perpendicular anisotropy field increases. We have found that PMA is established in the free layer by maintaining thickness d in FIG. 1 in the 5 to 25 Angstrom range. In many free layer configurations, if thickness d is greater than about 25 Angstroms, then the shape anisotropy field is too large to be overcome by an out-of plane component, and the net magnetization of the free layer remains in-plane.

A cap layer 17 is formed on the free layer 16 and is preferably comprised of an oxide that is one of MgTaOx, MgO, SiOx, SrTiOx, BaTiOx, CaTiOx, LaAlOx, MnOx, VOx, $Al_2O_3$, TiOx, BOx, and HfOx. In some embodiments, the cap layer is a lamination of one or more of the aforementioned oxides. Preferably, the cap layer is MgO with a RA value of less than about 1 ohm-mm$^2$, which is substantially less than the RA value of the tunnel barrier. In some cases, the total RA for the MTJ is <10 ohm-mm$^2$ while in other embodiments, the total RA value is below 20 ohm-mm$^2$. The cap layer may be formed by a process similar to the one used in tunnel barrier formation in which a metal or alloy layer is deposited and is then oxidized by a radical oxidation (ROX) or natural oxidation (NOX) process. Since the metal oxide cap does contribute to resistance×area (RA) value for the MTJ but does not factor into the TMR ratio, the thickness of a MgO cap layer or the like must be minimized to avoid a higher than desired RA.

A key feature of the present disclosure is a diffusion barrier 18 formed between the cap layer and an overlying hard mask 19. The diffusion barrier is designed to block the migration of non-magnetic metals and their conductive oxides and nitrides from the hard mask into the cap layer 17 during high temperature processing up to about 400° C. thereby preventing a condition where hard mask metal(s) displace a portion of metal oxide along interface 41 and cause a decrease in PMA in free layer 16. In addition, the diffusion barrier must not migrate into the cap layer. To satisfy this requirement, the material selected for the diffusion barrier should be heavier than Mg or the metal in the metal oxide cap layer. In this context, "heavier" is defined as having a higher atomic number in the Periodic Table. Secondly, the diffusion barrier should bind better to the cap layer than the hard mask materials. The term "bind" is understood to mean dipole-dipole attractions between two atoms or molecules that are also known as van del Waal forces. Furthermore, the diffusion barrier should remain amorphous or have the same crystal structure as the Hk enhancing (cap) layer after a 400° C. anneal. The diffusion barrier preferably has a thickness of 3 to 10 Angstroms and in some bilayer embodiments, may reach a total thickness of 20 Angstroms. A thickness of at least 3 Angstroms is considered necessary to form a continuous film without gaps therein in order to have sufficient blocking capability to prevent easy migration of metals from the hard mask into the cap layer.

In the first embodiment, the diffusion layer 18 is non-magnetic and is a single metal or alloy that is one of SiN, TiN, TaN, Mo, Cr, W, V, or $Co_aFe_bX_c$ wherein X is one of Zr, Nb, Hf, Mo, Cu, B, P, and Ta, (a+b+c)=100 atomic %, and the X content which is responsible for the non-magnetic character has a maximum content of 50 atomic % in the CoFeX alloy. Moreover, one of "a" or "b" may be zero to yield a CoX or FeX diffusion barrier. In an alternative embodiment, Ni may be included in the diffusion barrier to give a CoFeNiX alloy.

Above the diffusion barrier 18 is a hard mask 19 with a thickness in the range of about 50 to 300 Angstroms. One of the hard mask functions is to act as a protective layer with substantial resistance to a subsequent chemical mechanical polish (CMP) process where a top surface of the hard mask is planarized such that it is coplanar with an adjoining insulation layer as described in a later section. The hard mask also serves as an electrical connection from the underlying MTJ layers to a top electrode 20 and offers substantial resistance to oxidation. The hard mask is preferably made of one or more of Ta and Ru, or is Mo, or MnPt. In one example, the hard mask is a Ru/Ta stack where the lower Ru layer contacts a top surface of the diffusion barrier.

Above MTJ 1 is a top electrode 20 that contacts a top surface of hard mask 19. The top electrode is usually one in a plurality of parallel lines that are formed in a MRAM array and typically comprises Cu or another efficient electrical conductor. In some embodiments, a cladding layer (not shown) is formed around an inner conductive layer. Only one top electrode is shown in order to simplify the drawing and focus on the MTJ structure that is the key feature of the present disclosure. For STT-MRAM, a current is directed through the MTJ between the top electrode and bottom electrode 10 for reading or writing purposes. In a MRAM write process, a current in the top electrode and bottom electrode generates a magnetic field on the MTJ that is capable of switching the magnetization direction in the free layer. In STO devices, the bottom electrode may be a main pole while the top electrode is a trailing shield as appreciated by those skilled in the art.

Figure 2:
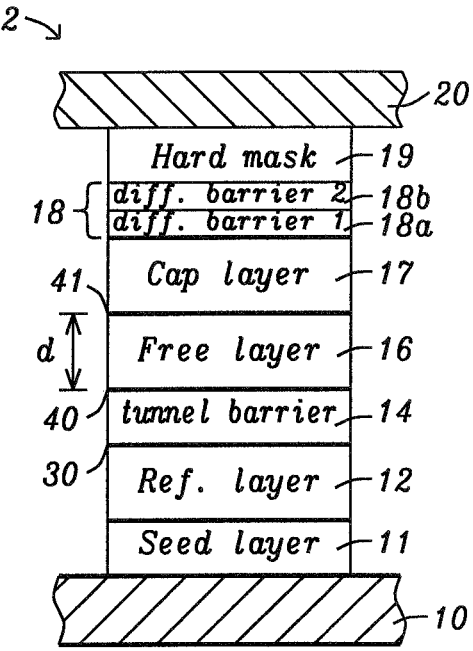
FIG. 2 is a cross-sectional view of a MTJ with a bottom spin valve design with a diffusion barrier formed between a cap layer and a top electrode according to a second embodiment of the present disclosure.

According to a second embodiment shown in FIG. 2, MTJ 2 retains all the layers previously described in the first embodiment. However, the diffusion barrier 18 is modified to have a multilayer configuration in which an upper layer 18b is a so-called "heavy" material to block non-magnetic metal diffusion from the hard mask 19, and a lower layer 18a is employed to bind well with the cap layer 17 but is made of a less "heavy" material than in layer 18b to prevent diffusion of the upper layer into the cap layer. In a preferred embodiment, a CoFeB/Mo bilayer is selected for the diffusion barrier. However, another CoFeX or CoFeNiX alloy may replace CoFeB, and one of SiN, TaN, TiN, W, Cr, or V may replace Mo. The lower CoFeB layer contacts the Hk enhancing layer 17 and assures that Mo in the upper layer 18b does not diffuse into the Hk enhancing layer. Meanwhile, upper layer 18b preferably remains amorphous and binds well to the hard mask to prevent non-magnetic metal migration from the hard mask into the Hk enhancing layer. Lower layer 18a and upper layer 18b each have a minimum thickness of about 2 to 3 Angstroms. A maximum thickness of diffusion barrier layer 18 is preferably about 20 Angstroms.

Figure 3:
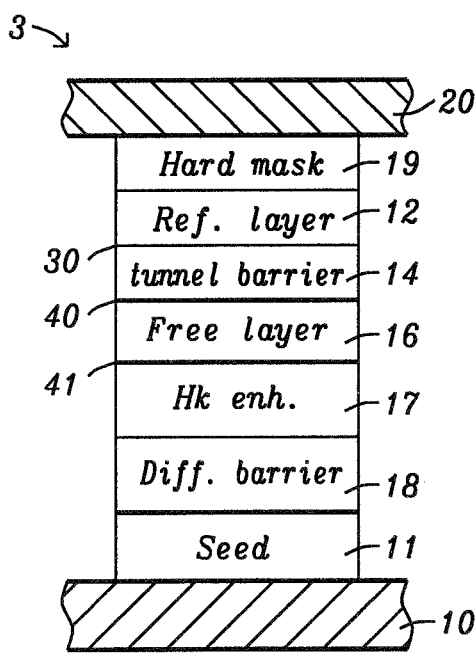
FIG. 3 is a cross-sectional view of the MTJ stack with a top spin valve design with a diffusion barrier formed between a Hk enhancing layer and bottom electrode according to a third embodiment of the present disclosure.

The present disclosure also anticipates an embodiment with a top spin valve configuration as illustrated for MTJ 3 in FIG. 3. All layers are retained from FIG. 1 except the order of formation is different. In particular, optional seed layer 11, diffusion barrier 18, Hk enhancing layer 17, free layer 16, tunnel barrier 14, reference layer 12, and hard mask 19 are sequentially formed on bottom electrode 10. Moreover, there is a first interface 41 between a bottom surface of the free layer and a top surface of the Hk enhancing layer, and a second interface 40 where a top surface of the free layer adjoins a bottom surface of the tunnel barrier. There is also an interface 30 where the tunnel barrier contacts a bottom surface of the reference layer. In this case, the diffusion barrier blocks the migration of non-magnetic metals from the bottom conductor and optional seed layer through the Hk enhancing layer to interface 41 and the free layer. A similar advantage to that associated with MTJ 1 and MTJ 2 is realized. Namely, interfacial perpendicular anisotropy is maintained at interface 41, and thus PMA as well as thermal stability and coercivity in the free layer is not degraded after high temperature processing to about 400° C.

Figure 4:
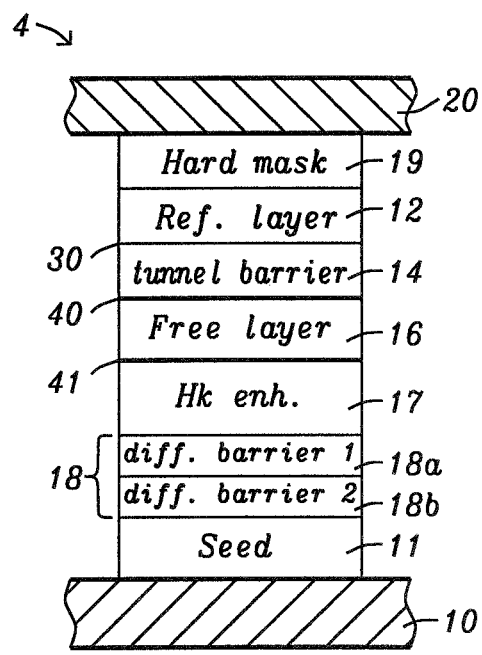
FIG. 4 is a cross-sectional view of the MTJ stack with a top spin valve design with a diffusion barrier formed between a Hk enhancing layer and bottom electrode according to a fourth embodiment of the present disclosure.

In an alternative embodiment depicted in FIG. 4 as MTJ 4, all layers are retained from FIG. 3 except the diffusion barrier 18 is modified to a bilayer configuration in which previously described layer 18b contacts a top surface of the seed layer or bottom electrode, and layer 18a is formed on layer 18b and adjoins a bottom surface of the Hk enhancing layer 17. The diffusion barrier provides the same benefits that were explained with respect to the third embodiment in FIG. 3.

Figure 5:
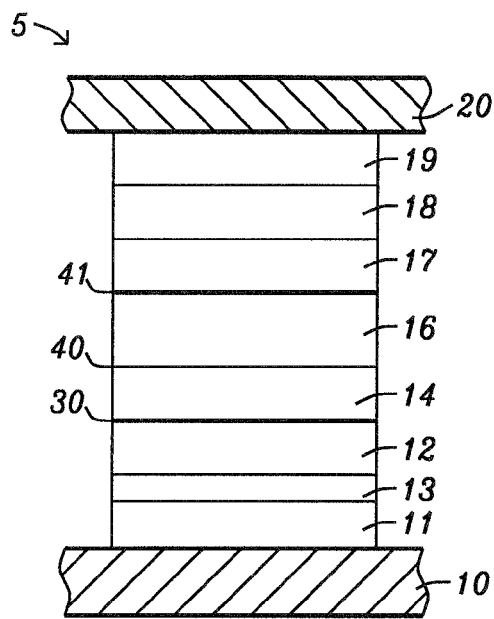
FIG. 5 is a cross-sectional view of a MTJ stack having two diffusion barriers therein according to a fifth embodiment of the present disclosure.

Referring to FIG. 5, the present disclosure also encompasses an embodiment with a bottom spin valve design that comprises two diffusion barrier layers wherein a first diffusion barrier is formed between the free layer and a first electrode, and a second diffusion barrier is inserted between the reference layer and a second electrode. In the exemplary embodiment, all of the layers in the first embodiment are retained, and a second diffusion barrier 13 is inserted between the optional seed layer 11 (or bottom electrode 10) and reference layer 12. The second diffusion layer is non-magnetic and is preferably selected from one or more of the materials previously described with regard to diffusion barrier 18. In an alternative embodiment (not shown), a second non-magnetic diffusion barrier is inserted between the reference layer and hard mask in FIG. 3.

Figure 6:
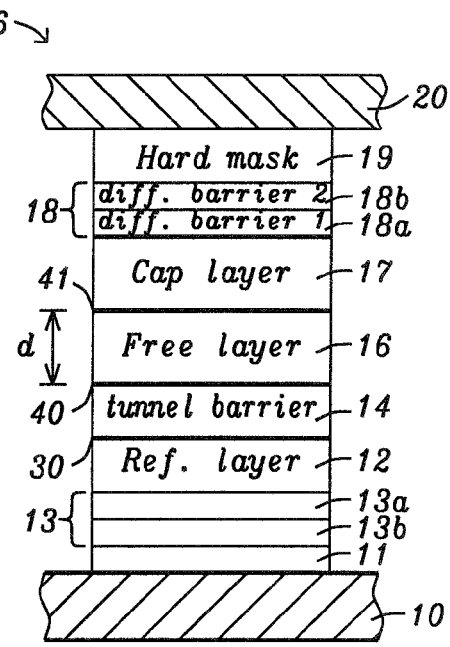
FIG. 6 is a cross-sectional view of a MTJ with two diffusion barriers each having a bilayer structure according to a sixth embodiment of the present disclosure.

In another embodiment shown in FIG. 6, MTJ 6 may have two diffusion barriers that both have a bilayer stack. The MTJ layers in FIG. 2 are retained, and a second diffusion barrier 13 with upper layer 13a and lower layer 13b is inserted between the optional seed layer 11 (or bottom electrode 10) and reference layer 12. Thus, the second diffusion layer may be a bilayer with a Mo/CoFeB configuration, for example, where the bottom layer 13b is a CoFeX or CoFeNiX alloy described previously while the upper layer 13a is one of SiN, TaN, TIN, Mo, V, Cr, or W. In FIGS. 5-6, the second diffusion barrier is advantageously used to prevent heavy metals from the bottom electrode 10 and seed layer 11 from migrating to interface 30 and thereby degrading PMA in the reference layer.

Figure 7:
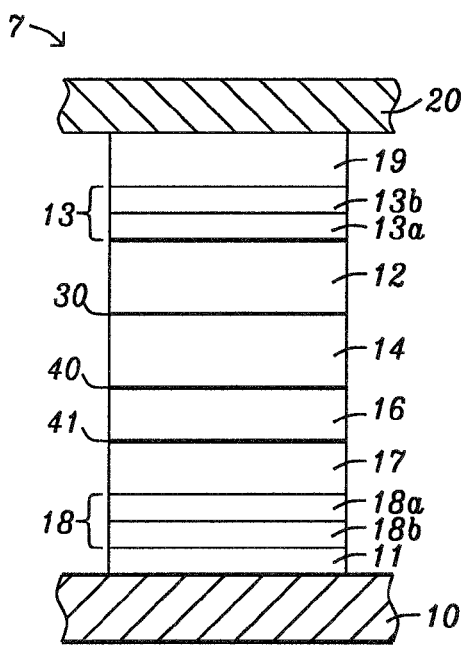
FIG. 7 is a cross-sectional view of a MTJ with two diffusion barriers each having a bilayer structure according to a seventh embodiment of the present disclosure.

In FIG. 7, the present disclosure further anticipates a top spin valve (MTJ 7) embodiment wherein FIG. 4 is modified to include a second non-magnetic diffusion barrier 13 having a bilayer configuration that is formed between the reference layer 12 and hard mask 19. In this case, bottom layer 13a contacts a top surface of the reference layer and top layer 13b adjoins a bottom surface of the hard mask. Moreover, a second Hk enhancing layer (not shown) may be included between the reference layer and second diffusion barrier to establish a second metal oxide/reference layer interface and further enhance PMA in the reference layer.

Figure 8:
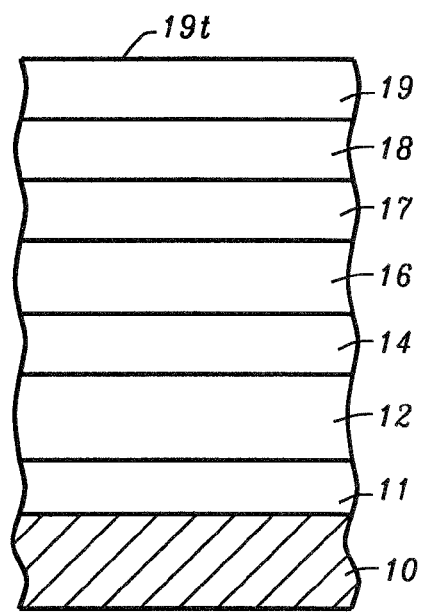

The present disclosure also encompasses a method of forming a MTJ element having a configuration as disclosed herein between bottom and top electrodes. Referring to FIG. 8, a MTJ stack of layers is formed on a substrate that comprises a bottom electrode layer 10. In one embodiment, the seed layer 11, reference layer 12, tunnel barrier 14, free layer 16, Hk enhancing layer 17, diffusion barrier 18, and hard mask 19 are sequentially formed on the substrate. All layers may be laid down by a sputter deposition technique. In a preferred embodiment, the tunnel layer is formed by depositing a first metal (or alloy) layer, oxidizing the first metal layer with a NOX or ROX method, and then depositing a second metal or alloy layer on the oxidized first metal layer. In some cases, the second metal layer may be oxidized and a third metal layer is deposited on the oxidized second metal layer. Thereafter, the free layer is depositing on the uppermost metal layer.

Once all of the layers in the multilayer stack and MTJ are formed, an annealing process may be performed that is comprised of at least a final treatment at about 400° C. for 1 minute to 5 hours, and preferably 30 to 50 minutes. The annealing process transforms the tunnel barrier stack into a substantially uniform metal oxide layer.

Referring to FIG. 9, a photoresist layer is deposited on a top surface of the MTJ and is patterned by a conventional method to form a photoresist mask 50 with a top-down view (not shown) in the desired shape of the MRAM device. Thereafter, an ion beam etch or reactive ion etch is used to transfer the photoresist mask pattern through the underlying layers in the MTJ to form sidewalls 1s. In the exemplary embodiment, sidewalls 1s and 50s are formed along the same plane that is essentially orthogonal to a top surface of bottom electrode 10. In other embodiments, sidewall 1s may be aligned with a slope such that the seed layer has a greater width in the x-axis direction than hard mask 19. Here, the thickness of each MTJ layer is related to a distance along the y-axis direction. Preferably, the free layer 16 and reference layer 14 have a magnetization either in the (+) y-axis or (−) y-axis direction.

Referring to FIG. 10, an insulation layer 55 such as alumina or $SiO_2$ is deposited that contacts sidewall 1s to a thickness at least as great as the MTJ stack of layers. Then, a chemical mechanical polish (CMP) process is performed to remove the photoresist mask and form a top surface 55t of the insulation layer that is coplanar with top surface 19t of the uppermost layer in the MTJ. The MTJ is now often referred to as a nanopillar because the structure resembles a pillar with lateral dimensions along the x and z axes that is typically smaller than the thickness in the y-axis direction. From a top-down view (not shown), the MTJ nanopillar may have a circular, elliptical, or polygonal shape. Thereafter, a top electrode layer 20 is deposited and patterned to give a plurality of parallel lines by a well known process to form a magnetic memory device as depicted in FIG. 1 or FIG. 2.

Formation of a MTJ with a top spin valve design such as one depicted in FIG. 3 or FIG. 4 follows the same process flow represented in FIGS. 9-11 with the exception that the order of the layers deposited in FIG. 9 is changed. In particular, an optional seed layer 11, diffusion barrier 18, Hk enhancing layer 17, free layer 16, tunnel barrier 14, reference layer 12, and hard mask 19 are sequentially formed on a bottom electrode 10 before sidewall 1s is generated in a patterning and etch process previously described with respect to FIG. 10.

To demonstrate the benefits of a diffusion barrier according to the present disclosure, patterned MTJ elements were fabricated as circular 100 nm MRAM devices and the Hc field for each was measured. Reference MTJ A has a seed layer/reference layer/MgO tunnel barrier/free layer/MgO cap layer/Ru/Ta configuration wherein the reference layer and free layer are CoFeB based material, the Hk enhancing layer is a MgO cap layer, and the hard mask is Ru/Ta. MTJ B and MTJ C are formed according to an embodiment of the present disclosure and differ from the reference MTJ A only by including a diffusion barrier between the Hk enhancing layer and the hard mask. All structures were deposited at room temperature and annealed at 330° C. for 30 minutes. A first coercivity measurement was taken after the first anneal step and then a second anneal process at 400° C. for 30 minutes was performed. A second coercivity measurement was obtained following the second anneal. As shown in Table 1, all MTJs have Hc=3200 Oe after the first anneal. However, Hc for MTJ A is undesirably reduced to 1600 Oe after the second anneal. A significant improvement is achieved in MTJs with a diffusion barrier since Hc is maintained at 3200 Oe in MTJ B, or even increased to 3300 Oe in MTJ C following the second anneal. In some applications, a minimum Hc of >3200 Oe is required after high temperature anneal. In addition, it is important that Hc after a 400° C. anneal should not decrease compared with a value obtained after a 330° C. anneal. Note that 400° C. is an industry standard for semiconductor manufacturing to reduce the defect rate of the product and therefore becomes a requirement for embedded MRAM applications.

TABLE 1

Coercivity results for MTJ elements with free layer/Hk enhancing layer/diffusion barrier/hard mask configurations

| MTJ | Hk enhancing layer | Diffusion barrier | Hc (Oe) after 330° C., 30 min. anneal | Hc (Oe) after 400° C., 30 min. anneal |
|---|---|---|---|---|
| A | MgO | None | 3200 | 1600 |
| B | MgO | 5 Angstroms Mo | 3200 | 3200 |
| C | MgO | 5 Angstroms CoFeB/ 5 Angstroms Mo | 3200 | 3300 |

The benefits of the present disclosure are an improved PMA (Hc and Hk) for a free layer in a magnetic device that will increase the retention time for a memory element such as a MTJ following high temperature processing up to 400° C. that is required for MRAM or STT-MRAM devices integrated in CMOS structures. Furthermore, the processes and materials described herein are compatible with the design and processing requirements of magnetic devices. The fabrication of a MTJ according to an embodiment of this disclosure is not expected to significantly impact the manufacturing cost.

While this disclosure has been particularly shown and described with reference to, the preferred embodiment thereof, it will be understood by those skilled in the art that various changes in form and details may be made without departing from the spirit and scope of this disclosure.

We claim:

1. A magnetic memory element formed between a first electrode and a second electrode, comprising:
   (a) a tunnel barrier layer that forms a first interface with a first surface of a free layer and thereby induces or enhances perpendicular magnetic anisotropy (PMA) in the free layer;
   (b) the free layer;
   (c) an Hk enhancing layer which is a metal oxide layer that forms a second interface with the free layer at a second surface thereof that is opposite the first surface, and thereby induces or enhances PMA in the free layer; and
   (d) a non-magnetic diffusion barrier formed between the Hk enhancing layer and one of the first electrode or the second electrode, the non-magnetic diffusion barrier comprises at least one of SiN, TiN, Mo, W, Cr, V, or $Co_aFe_bX_c$ or CoFeNiX wherein X is one of Zr, Hf, Nb, Cu, Mo, B, P, and Ta, and (a+b+c)=100 atomic %.

2. The magnetic memory element of claim 1 further comprising a reference layer that adjoins the tunnel barrier at a surface opposite the first interface, and a hard mask layer that is one or more of Ta, Ru, and MnPt formed between the non-magnetic diffusion barrier and the top electrode in a bottom spin valve design.

3. The magnetic memory element of claim 2 wherein the non-magnetic diffusion barrier is a bilayer having a lower CoFeX or CoFeNiX layer that contacts a top surface of the Hk enhancing layer, and an upper layer that is one of SiN, TiN, TaN, Mo, V, W, or Cr that adjoins a bottom surface of the hard mask layer.

4. The magnetic memory element of claim 3 wherein each of the lower CoFeX or CoFeNiX layer and the upper layer has a minimum thickness of about 2 to 3 Angstroms, and a maximum thickness of the bilayer is about 20 Angstroms.

5. The magnetic memory element of claim 1 wherein the Hk enhancing layer is one of MgTaOx, MgO, SiOx, SrTiOx, BaTiOx, CaTiOx, LaAlOx, MnOx, VOx, $Al_2O_3$, TiOx, BOx, or HfOx, or is a laminate of one or more of the aforementioned oxides.

6. The magnetic memory element of claim 1 wherein the non-magnetic diffusion barrier is a single layer with a thickness from about 3 to 10 Angstroms.

7. The magnetic memory element of claim 1 having a top spin valve design and further comprising a seed layer, a reference layer, and a hard mask to give a seed layer/diffusion barrier/Hk enhancing layer/free layer/tunnel barrier/reference layer/hard mask configuration in which the seed layer contacts the first electrode and the hard mask contacts a bottom surface of the second electrode.

8. The magnetic memory element of claim 7 wherein the non-magnetic diffusion barrier is a bilayer having an upper CoFeX or CoFeNiX layer that contacts a bottom surface of the Hk enhancing layer, and a lower layer that is one of SiN, TiN, TaN, Mo, V, W, or Cr that adjoins a top surface of the seed layer.

9. The magnetic memory element of claim 8 wherein each of the lower layer and the upper CoFeX or CoFeNiX layer has a minimum thickness of about 2 to 3 Angstroms, and the bilayer has a maximum thickness of about 20 Angstroms.

10. The magnetic memory element of claim 1 wherein the non-magnetic diffusion barrier comprises a CoFeX layer wherein X has a maximum content of about 50 atomic %.

11. A magnetic memory element formed between a first electrode and a second electrode, comprising:
   (a) a tunnel barrier layer that forms a first interface with a first surface of a free layer and thereby induces or enhances perpendicular magnetic anisotropy (PMA) in the free layer;
   (b) the free layer;
   (c) a reference layer that contacts a side of the tunnel barrier that is opposite the first interface;
   (d) an Hk enhancing layer which is a metal oxide that forms a second interface with the free layer at a second surface thereof that is opposite the first surface, and thereby induces or enhances PMA in the free layer;
   (e) a first non-magnetic diffusion barrier formed between the Hk enhancing layer and the first electrode; and
   (f) a second non-magnetic diffusion barrier formed between the reference layer and the second electrode, each of the first and second non-magnetic diffusion barriers comprises at least one of SiN, TIN, Mo, W, Cr, V, or $Co_aFe_bX_c$ or CoFeNiX wherein X is one of Zr, Hf, Nb, Cu, Mo, B, P, and Ta, and (a+b+c)=100 atomic %.

12. The magnetic memory element of claim 11 further comprising a hard mask that is one or more of Ta, Ru, and MnPt formed between the first non-magnetic diffusion barrier and the first electrode in a bottom spin valve design.

13. The magnetic memory element of claim 12 wherein each of the first and second non-magnetic diffusion barriers is a bilayer, the first non-magnetic diffusion barrier has a CoFeX or CoFeNiX layer that contacts a top surface of the Hk enhancing layer and a second layer that adjoins a bottom surface of the hard mask, and the second diffusion barrier has a CoFeX or CoFeNiX layer contacting a bottom surface of the reference layer, and a second layer that adjoins a top surface of a seed layer in a bottom spin valve design wherein each of the second layers in the first and second non-magnetic diffusion barriers is one of SiN, TiN, TaN, Mo, V, W, or Cr.

14. The magnetic memory element of claim 13 wherein each of the CoFeX or CoFeNiX layers, and the second layers has a minimum thickness of about 2 to 3 Angstroms, and a maximum thickness of each of the bilayers is about 20 Angstroms.

15. The magnetic memory element of claim 11 wherein the Hk enhancing layer is one of MgTaOx, MgO, SiOx, SrTiOx, BaTiOx, CaTiOx, LaAlOx, MnOx, VOx, $Al_2O_3$, TiOx, BOx, or HfOx, or is a laminate of one or more of the aforementioned oxides.

16. The magnetic memory element of claim 11 wherein each of the first and second non-magnetic diffusion barriers is a single layer with a thickness from about 3 to 10 Angstroms.

17. The magnetic memory element of claim 11 further comprising a hard mask between the second electrode and the second electrode in a top spin valve configuration wherein each of the first and second non-magnetic diffusion barriers is a bilayer, the first non-magnetic diffusion barrier has a CoFeX or CoFeNiX layer that contacts a bottom surface of the Hk enhancing layer and a second layer that adjoins a top surface of a seed layer, and the second diffusion barrier has a CoFeX or CoFeNiX layer contacting a top surface of the reference layer, and a second layer that adjoins a bottom surface of the hard mask wherein each of the second layers is one of SiN, TIN, TaN, Mo, V, W, or Cr.

18. The magnetic memory element of claim 17 wherein each of the CoFeX or CoFeNiX, and second layers has a minimum thickness of about 2 to 3 Angstroms, and each of the bilayers has a maximum thickness of about 20 Angstroms.

19. The magnetic memory element of claim 11 wherein each of the first and second non-magnetic diffusion barriers comprises a CoFeX layer wherein X has a maximum content of about 50 atomic %.

20. A method of forming a magnetic memory element with a stack of layers, comprising:
(a) depositing a reference layer above a substrate;
(b) forming a tunnel barrier on the reference layer;
(c) depositing a free layer that contacts a top surface of the tunnel barrier to form a first interface which induces or enhances perpendicular magnetic anisotropy (PMA) in the free layer;
(d) forming a metal oxide layer that contacts a top surface of the free layer to form a second interface that induces or enhances PMA in the free layer;
(e) depositing a non-magnetic diffusion barrier on the metal oxide layer, the non-magnetic diffusion barrier comprises at least one of SiN, TiN, Mo, W, Cr, V, or $Co_aFe_bX_c$ or CoFeNiX wherein X is one of Zr, Hf, Nb, Cu, Mo, B, P, and Ta, and (a+b+c)=100 atomic %;
(f) forming a hard mask on the non-magnetic diffusion barrier; and
(g) annealing the stack of layers.

21. The method of claim 20 wherein the metal oxide layer is one of MgTaOx, MgO, SiOx, SrTiOx, BaTiOx, CaTiOx, LaAlOx, MnOx, VOx, $Al_2O_3$, TiOx, BOx, or HfOx, or is a laminate of one or more of the aforementioned oxides.

22. The method of claim 20 wherein the non-magnetic diffusion barrier is a single layer with a thickness from about 3 to 10 Angstroms.

23. The method of claim 20 wherein the non-magnetic diffusion barrier is a bilayer having a lower CoFeX or CoFeNiX layer that contacts a top surface of the metal oxide layer, and an upper layer that is one of SiN, TiN, TaN, Mo, V, W, or Cr that adjoins a bottom surface of the hard mask.

24. The method of claim 23 wherein each of the lower CoFeX or CoFeNiX layer, and upper layer has a minimum thickness of about 2 to 3 Angstroms, and a maximum thickness of the bilayer is about 20 Angstroms.

25. The method of claim 20 wherein the substrate comprises a second non-magnetic diffusion barrier comprising at least one of SiN, TiN, Mo, W, Cr, V, or $Co_aFe_bX_c$ or CoFeNiX wherein X is one of Zr, Hf, Nb, Cu, Mo, B, P, and Ta, and (a+b+c)=100 atomic %.

26. A method of forming a magnetic memory element with a stack of layers, comprising:
(a) depositing a non-magnetic diffusion barrier over a substrate, the non-magnetic diffusion barrier comprises at least one of SiN, TiN, Mo, W, Cr, V, or $Co_aFe_bX_c$ or CoFeNiX wherein X is one of Zr, Hf, Nb, Cu, Mo, B, P, and Ta, and (a+b+c)=100 atomic %;
(b) forming a metal oxide layer on the non-magnetic diffusion barrier;
(c) depositing a free layer that contacts a top surface of the metal oxide layer to form a first interface which induces or enhances perpendicular magnetic anisotropy (PMA) in the free layer;
(d) forming a tunnel barrier that contacts a top surface of the free layer to form a second interface that induces or enhances PMA in the free layer;
(e) depositing a reference layer on the tunnel barrier;
(f) forming a hard mask on the reference layer; and
(g) annealing the stack of layers at a temperature of about 400° C.

27. The method of claim 26 wherein the metal oxide layer is one of MgTaOx, MgO, SiOx, SrTiOx, BaTiOx, CaTiOx, LaAlOx, MnOx, VOx, $Al_2O_3$, TiOx, BOx, or HfOx, or is a laminate of one or more of the aforementioned oxides.

28. The method of claim 26 wherein the non-magnetic diffusion barrier is a single layer with a thickness from about 3 to 10 Angstroms.

29. The method of claim 26 wherein the non-magnetic diffusion barrier is a bilayer having an upper CoFeX or CoFeNiX layer that contacts a bottom surface of the metal oxide layer, and a lower layer that is one of SiN, TiN, TaN, Mo, V, W, or Cr between the upper CoFeX or CoFeNiX layer and the substrate.

30. The method of claim 29 wherein each of the upper CoFeX or CoFeNiX layer, and lower layer has a minimum thickness of about 2 to 3 Angstroms, and a maximum thickness of the bilayer is about 20 Angstroms.

31. The method of claim 26 further comprised of forming a second non-magnetic diffusion barrier on the reference layer before forming the hard mask, the second non-magnetic diffusion barrier comprises at least one of SiN, TiN, Mo, W, Cr, V, or $Co_aFe_bX_c$ or CoFeNiX wherein X is one of Zr, Hf, Nb, Cu, Mo, B, P, and Ta, and (a+b+c)=100 atomic %.

* * * * *